(12) United States Patent
Tai et al.

(10) Patent No.: US 6,801,030 B2
(45) Date of Patent: Oct. 5, 2004

(54) CURRENT SENSE APPARATUS AND METHOD

(75) Inventors: Liang-Pin Tai, Tainan (TW);
Shwu-Liang Hsieh, Taichung (TW);
Hung-I Wang, Changhua (TW);
Jing-Meng Liu, Hsinchu (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 10/442,084

(22) Filed: May 21, 2003

(65) Prior Publication Data

US 2003/0218455 A1 Nov. 27, 2003

(30) Foreign Application Priority Data

May 27, 2002 (TW) ........................................ 91111367 A

(51) Int. Cl.[7] .............................................. G01R 33/00
(52) U.S. Cl. .............................. 324/117 R; 324/158.1; 323/316
(58) Field of Search ............................ 324/117 R, 765, 324/158.1; 323/313, 314, 315, 316, 317

(56) References Cited

U.S. PATENT DOCUMENTS 5,021,730 A * 6/1991 Smith .......................... 323/316
6,246,220 B1 * 6/2001 Isham et al. ................. 323/224
6,414,470 B1 * 7/2002 Liu et al. ..................... 323/272

* cited by examiner

*Primary Examiner*—David A. Zarneke
*Assistant Examiner*—Tung X. Nguyen
(74) *Attorney, Agent, or Firm*—Rosenberg, Klein & Lee

(57) ABSTRACT

A current sense apparatus and method comprises a common drain DMOSFET and a MOSFET connected in series between a high voltage and a low voltage to serve as an output stage. The DMOSFET produces a phase output current, a mirror current mirrored from the phase output current, and a sense voltage. A servo amplifier is connected with the mirror current and sense voltage to produce a current sense signal. Due to the mirror current from the DMOSFET proportional to the phase output current, the current sense apparatus senses the phase output current in a temperature independent manner.

9 Claims, 12 Drawing Sheets

CURRENT SENSE APPARATUS AND METHOD

FIELD OF THE INVENTION

The present invention relates generally to a current sense apparatus and method, and more particularly, to a temperature independent current sense apparatus and method.

BACKGROUND OF THE INVENTION

Multi-phase DC-to-DC converter has been widely used in power supplier circuits. A multi-phase buck converter typically employs a pair of MOSFETs connected in series for each phase as an output stage connected between a high voltage and a low voltage to produce a phase output. To obtain stable and balanced output, the output voltage and phase currents of a converter are sensed and fed back to the control circuit of the converter to produce the suitable control signals to manipulate the MOSFETs of the output stage. To feed back the current of each phase, a current sense apparatus is used to detect the current flowing through the phase, for example a scheme provided by U.S. Pat. No. 6,246,220 issued to Isham et al. producing the current sense signal by use of a current feedback resistor to feed back to the control circuit. Since the control of each phase is achieved by referring to the phase current detected by a current sense apparatus, the accuracy of the current sense apparatus will directly affect the phase balance and performance of the converter. However, the introduced resistors will affect the phase current, and unfortunately, the factors of electronic devices are temperature dependent, especially the resistances or transistors made of semiconductor. The increasing working temperature not only produces signal error but also brings the phase at higher temperature further sharing more currents, and thus leads to be burnt out.

Various conventional current sense apparatus used in synchronous switching mode buck converters are shown in FIG. 1. In FIG. 1A, a sense resistor 76 is introduced to be connected in series between the input voltage VIN and high side MOSFET 72, and the produced voltage drop further produces a current sense signal by an operational amplifier 25. In FIG. 1B, the sense resistor 76 is connected in series between a ground and the low side MOSFET 74, and the operational amplifier 25 detects the voltage drop across the resistor 76 to produce the current sense signal. Both of them introduce the additional sense resistor 76, and thus increase the cost and reduce the system efficiency. In FIG. 1C, the operational amplifier 25 directly detects the voltage drop across the conductive high side MOSFET 72 to produce the current sense signal. In FIG. 1D, the operational amplifier 25 directly detects the voltage drop across the conductive low side MOSFET 74 to produce the current sense signal. Both of them utilize the internal resistance of the MOSFET 72 or 74 as the sense resistor, and thus need not more cost for the sense resistor. However, the internal resistance of MOSFET varies with temperature, and the varied rate is about 5000 ppm, it is therefore not accurate of the measured current sense signal. In FIG. 1E, the parasitic resistor 78 of the output inductor 23 is used as the sense resistor, and it can be treated as connected in series between the inductor 23 and converter output 70. The operational amplifier 25 detects the voltage drop across the parasitic resistor 78 to produce the current sense signal, while the resistance of the parasitic resistor 78 is too small and hard to control. In FIG. 1F, the sense resistor 76 is connected in series between the inductor 23 and converter output 70, and the operational amplifier 25 detects the voltage drop across the resistor 76 to produce the current sense signal. This method introduces an additional resistor, and hence higher cost and poor system efficiency.

FIG. 6 shows a converter employing a conventional current sense apparatus as that in FIG. 1D, and only one phase is shown for simplicity. The operational amplifier 25 detects the voltage drop across the conductive low side MOSFET 74 and the produced current sense signal is connected to a sampling/holding circuit 50 that is also connected to the non-inverting input 302 of the error amplifier 30. Additionally, a voltage follower 32 connected with an original reference voltage REF produces a reference voltage to the node between resistor 34 and capacitor 36. The other terminal of the resistor 34 is connected to the non-inverting input 302 of the error amplifier 30. The inverting input 301 of the error amplifier 30 is connected with the output voltage VOUT, and a feedback signal 303 and the output of the sampling/holding circuit 50 are connected to the control logic 40 together to manipulate the output stage circuit, i.e., MOSFETs 72 and 74. Due to the current sense signal relating to the internal resistance of the MOSFET 74, which is temperature dependent, the current sense signal will change with temperature and result in error. Moreover, the converter output varies when load 60 changes, as shown in FIG. 7. FIG. 7A shows the waveforms of the converter output at low temperature, of which the upper one shows the transient performance of the variation Alout of the converter output current Iout resulted from load variation, and the lower one shows the ripple performance of the converter output voltage VOUT induced by this transient effect. FIG. 7B shows the waveforms of the converter output at high temperature. For the same load variation, the droop VDROOP of the converter output voltage VOUT is smaller at high temperature than that at low temperature. In other words, the performance of a converter is much affected by temperature. FIG. 8 shows a curve of the internal resistance of MOSFET to temperature variation. When temperature rises, the internal resistance of MOSFET also becomes larger, and therefore all operations incorporating the utilization of the internal resistance of MOSFET are affected by temperature.

SUMMARY OF THE INVENTION

One object of the present invention is to provide a current sense apparatus and method for temperature independent current sense.

Another object of the present invention is to provide a multi-phase switching mode DC-to-DC converter and method thereof incorporating a temperature independent current sense apparatus and method for balance control between each phase of the converter.

A further object of the present invention is to provide a multi-phase switching mode DC-to-DC converter and method thereof, whose control to voltage droop resulted from load variation is temperature independent by incorporating a temperature independent current sense apparatus and method.

The invented current sense apparatus and method uses a common drain DMOSFET and a MOSFET serving as an output stage connected between a high voltage and a low voltage, and connects the current and voltage sense outputs from the DMOSFET to a servo amplifier. When a phase output current is flowing through the DMOSFET, a mirror current mirrored from the phase output current and a sense voltage are produced, and the servo amplifier is connected with the mirror current and sense voltage to produce a current sense signal. Due to the mirror current from the DMOSFET proportional to the phase output current, the current sense thus obtained is temperature independent. Application of the current sense apparatus to a multi-phase switching mode DC-to-DC converter will make the performance of the converter temperature independent.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1A:
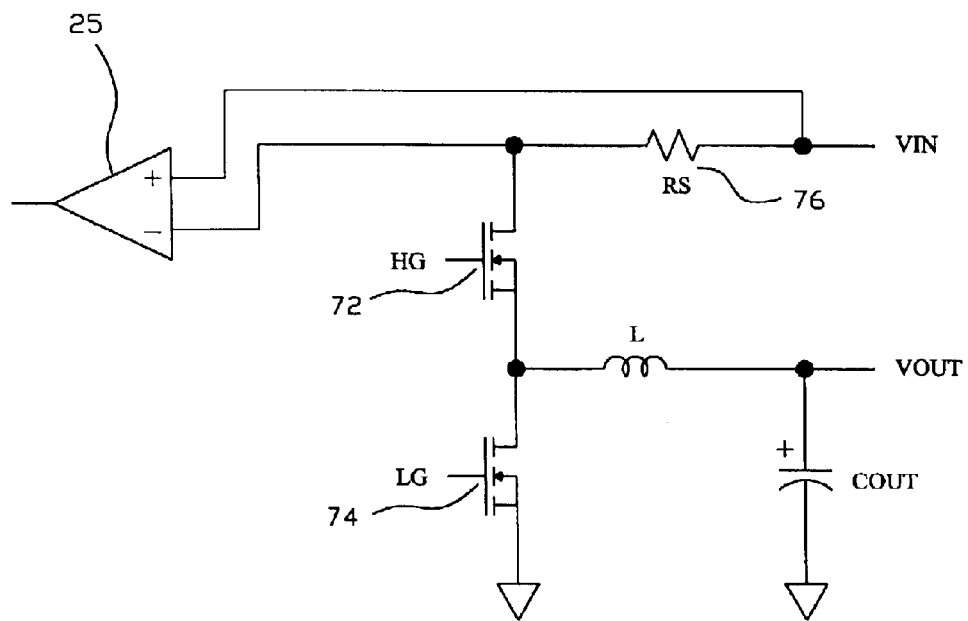
FIG. 1A is a conventional current sense apparatus with a high side resistor 76 and an operational amplifier 25 to detect the voltage drop across the resistor 76 to produce the current sense signal.
Figure 1B:
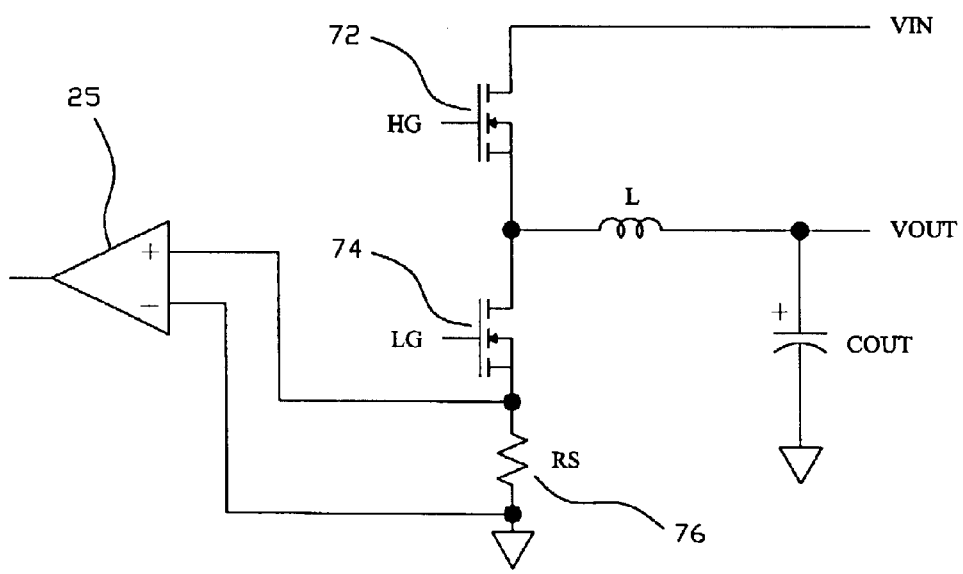
FIG. 1B is a conventional current sense apparatus with a low side resistor 76 and an operational amplifier 25 to detect the voltage drop across the resistor 76 to produce the current sense signal.
Figure 1C:
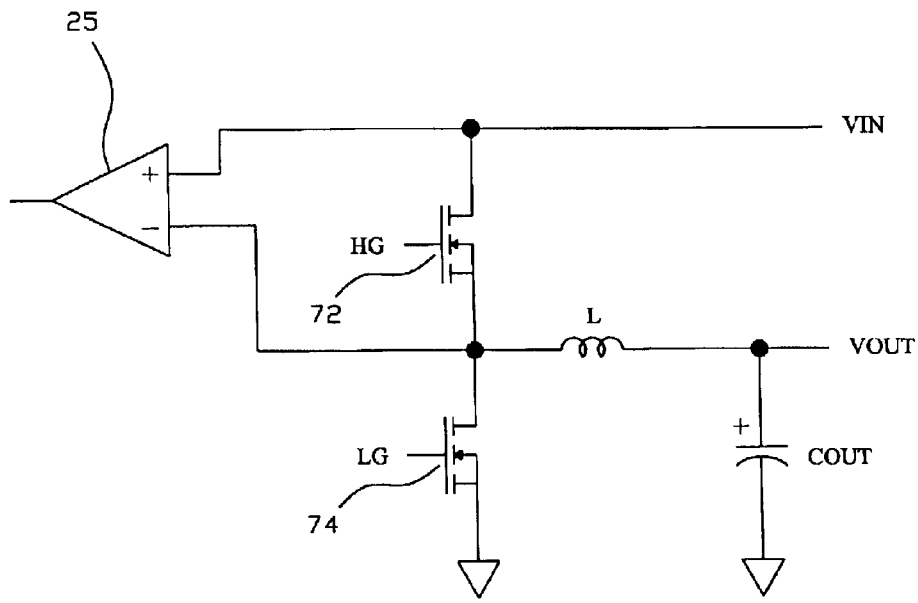
FIG. 1C is a conventional current sense apparatus with an operational amplifier 25 to detect the voltage drop across the high side MOSFET 72 to produce the current sense signal.
Figure 1D:
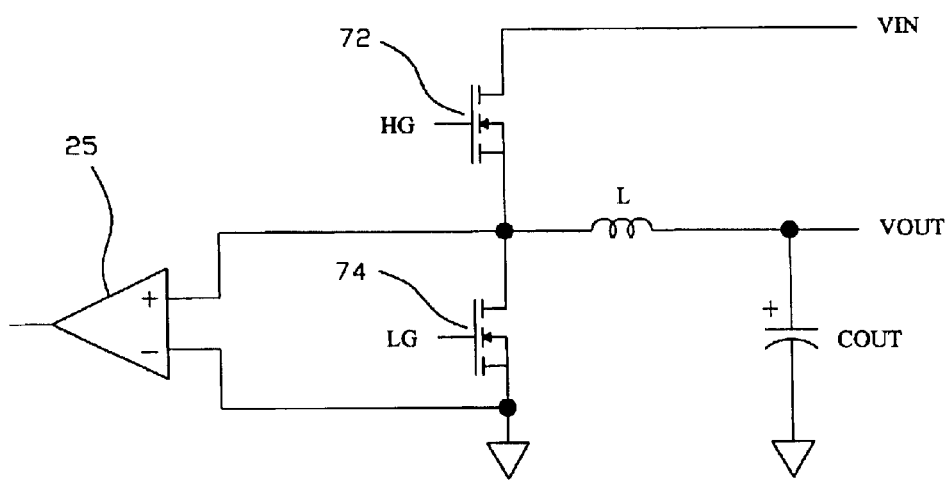
FIG. 1D is a conventional current sense apparatus with an operational amplifier 25 to detect the voltage drop across the low side MOSFET 74 to produce the current sense signal.
Figure 1E:
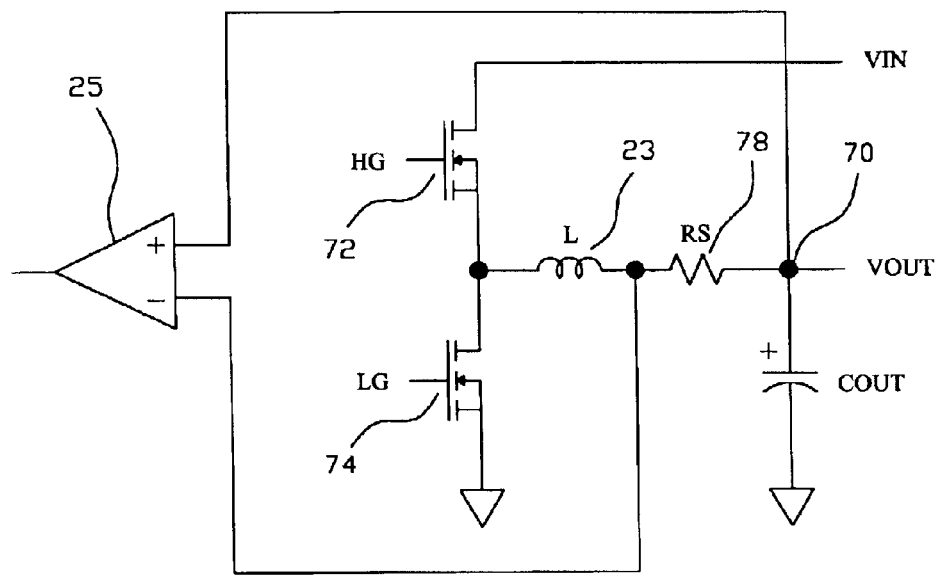
FIG. 1E is a conventional current sense apparatus with an operational amplifier 25 to detect the voltage drop across the parasitic resistor 78 of the output inductor 23 to produce the current sense signal.
Figure 1F:
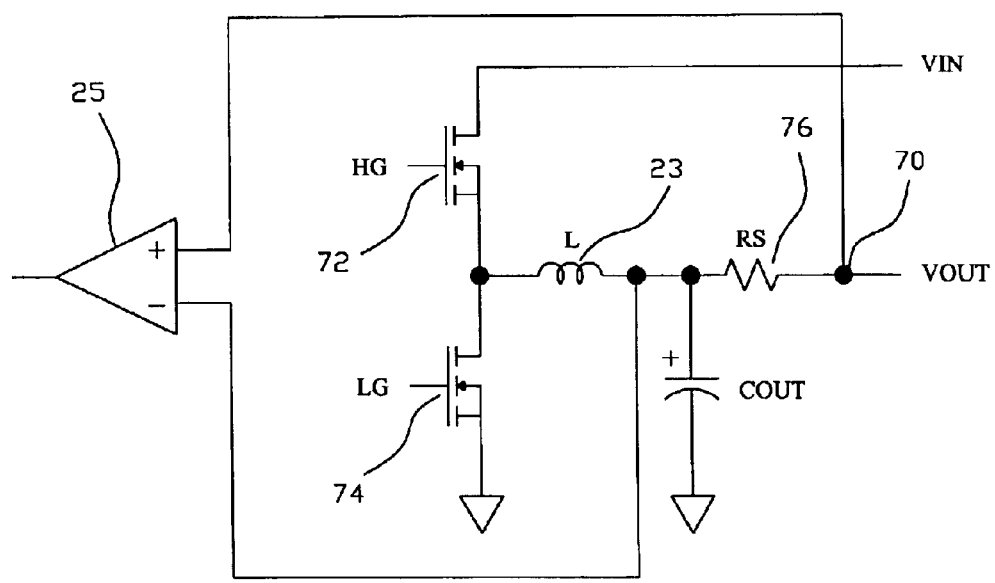
FIG. 1F is a conventional current sense apparatus with a resistor 76 connected between the inductor 23 and voltage output 70 and an operational amplifier 25 to detect the voltage drop across the resistor 76 to produce the current sense signal.
Figure 2A:
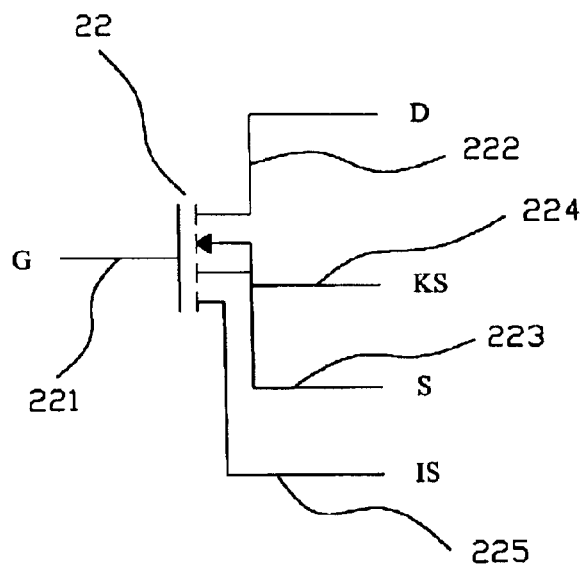
FIG. 2A is the circuit diagram of a common drain DMOSFET.
Figure 2B:
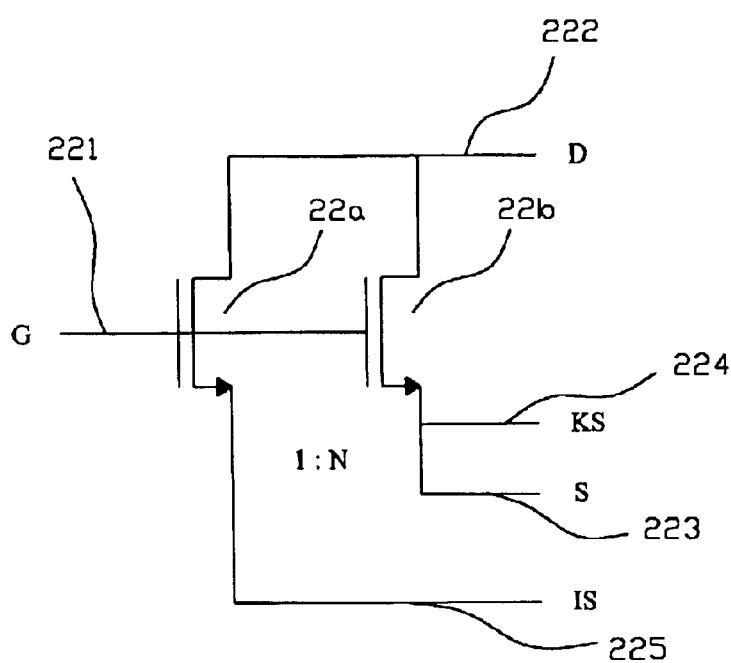
FIG. 2B is the equivalent circuit of the common drain DMOSFET shown in FIG. 2A, which is equivalent to two common gated MOSFETs with a ratio of 1:N.

FIG. 2A is the circuit diagram of a conventional common drain DMOSFET, of which a common drain DMOSFET 22 has 5 inputs/outputs (I/O) including a gate 221 (G), a drain 222 (D), a source 223 (S), a Kelvin sense 224 (KS) and a sense current 225 (IS), and which is equivalent to two common gated MOSFETs, as shown in FIG. 2B. The ratio of two MOSFETs 22a and 22b is 1:N, so that the current ratio of IS 225 and source 223 flowing through the common drain DMOSFET 22 is 1:N, no matter how temperature varies.

Figure 3:
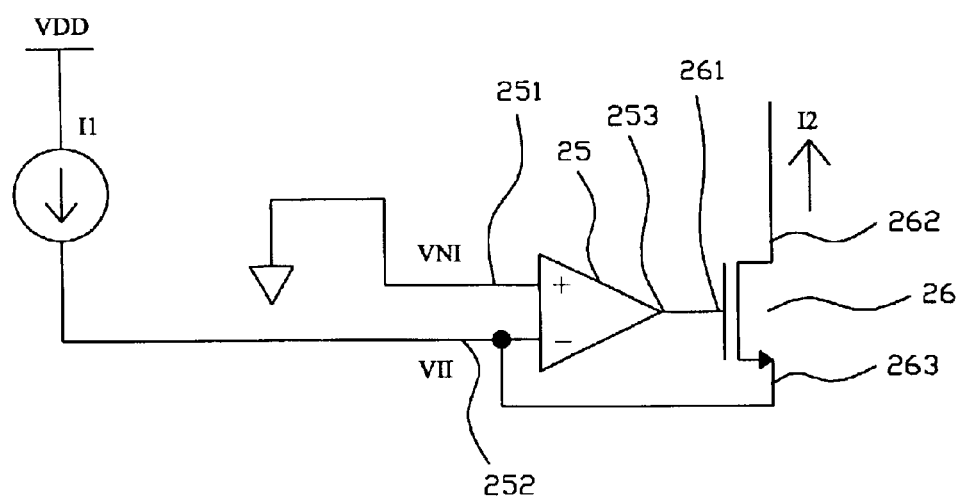
FIG. 3 is a servo amplifier used in the invented apparatus, which includes an operational amplifier 25 connected to a MOSFET 26.

FIG. 3 is an embodiment servo amplifier used by the invented apparatus, which includes an operational amplifier 25 and a MOSFET 26 with its gate 261 connected to the output 253 of the operational amplifier 25 and source 263 connected to the inverting input 252 of the operational amplifier 25 so as for a unit gain feedback circuit is obtained. The operation principle of this circuit is described below. With the non-inverting input 251 of the operational amplifier 25 grounded and a current source 11 connected to the inverting input 252 of the operational amplifier 25, the drain 262 of the MOSFET 26 will produce a current 12 as large as the current source 11.

Figure 4A:
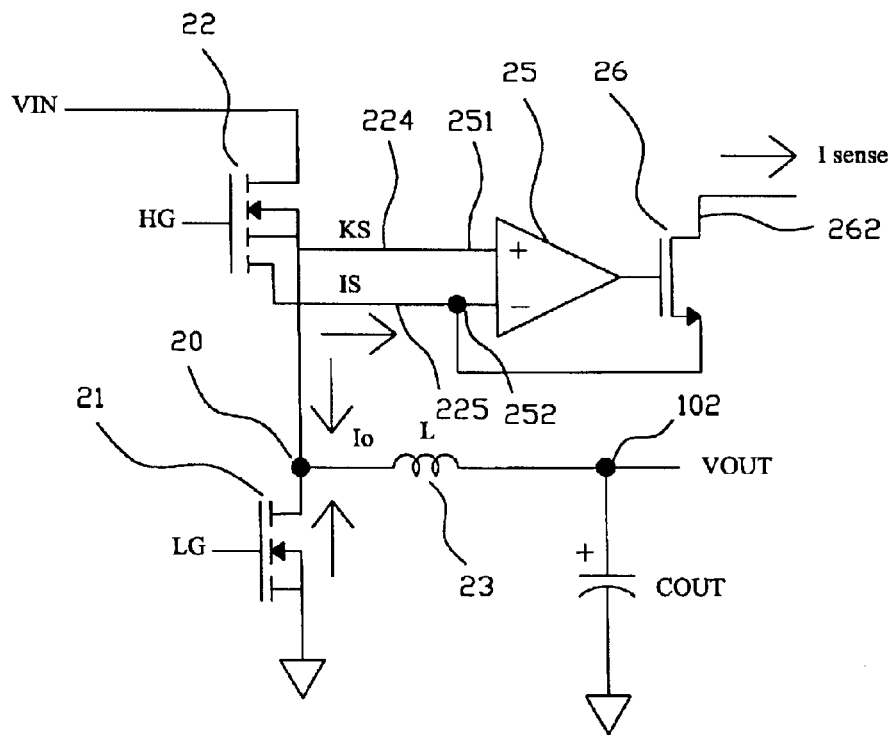
FIG. 4A is the first embodiment of the present invention, in which the common drain DMOSFET 22 is connected as a high side switch.
Figure 4B:
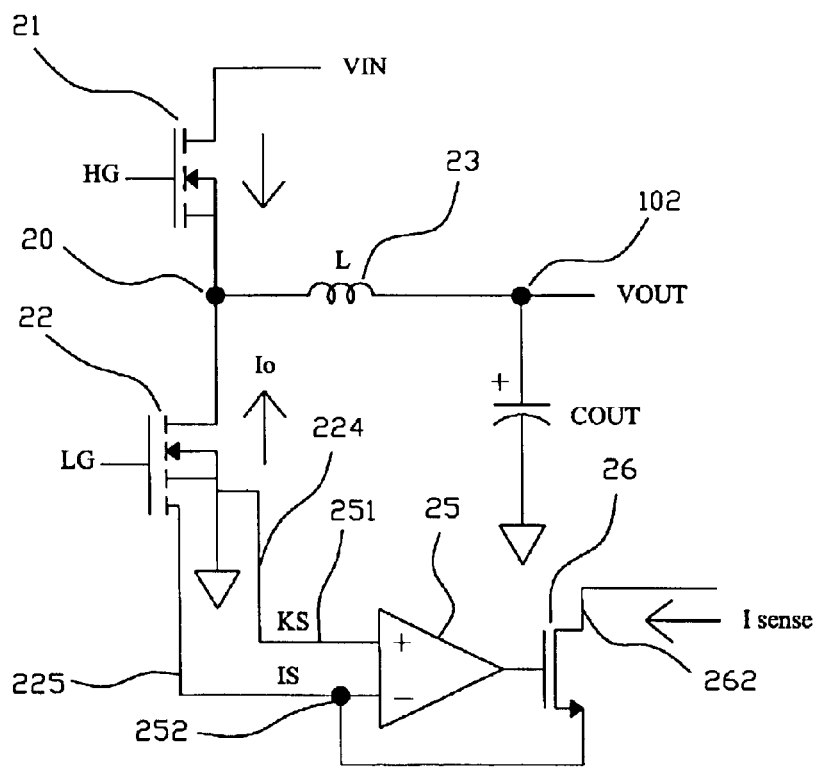
FIG. 4B is the second embodiment of the present invention, in which the common drain DMOSFET 22 is connected as a low side switch.

FIG. 4 shows two embodiments of the present invention. In FIG. 4A, the common drain DMOSFET 22 is connected as the high side switch of the output stage to be monitored, and in FIG. 4B the common drain DMOSFET 22 is connected as a the low side switch of the output stage to be monitored. In these two embodiments, the KS 224 and IS 225 of the common drain DMOSFET 22 are connected to the non-inverting input 251 and inverting input 252 of the operational amplifier 25, respectively. A phase output node 20 is provided between the common drain DMOSFET 22 and MOSFET 21 to produce a phase output for the converter output voltage VOUT on the converter output 102 through an output inductor 23. When a phase output current Io is flowing through the common drain DMOSFET 22, a mirror current IS=Io/N is produced for the servo amplifier and as a result, a current sense signal Isense=IS=Io/N is produced at the drain 262 of the MOSFET 26 of the servo amplifier, which current Isense is proportional to the phase output current Io and is temperature independent.

Figure 5:
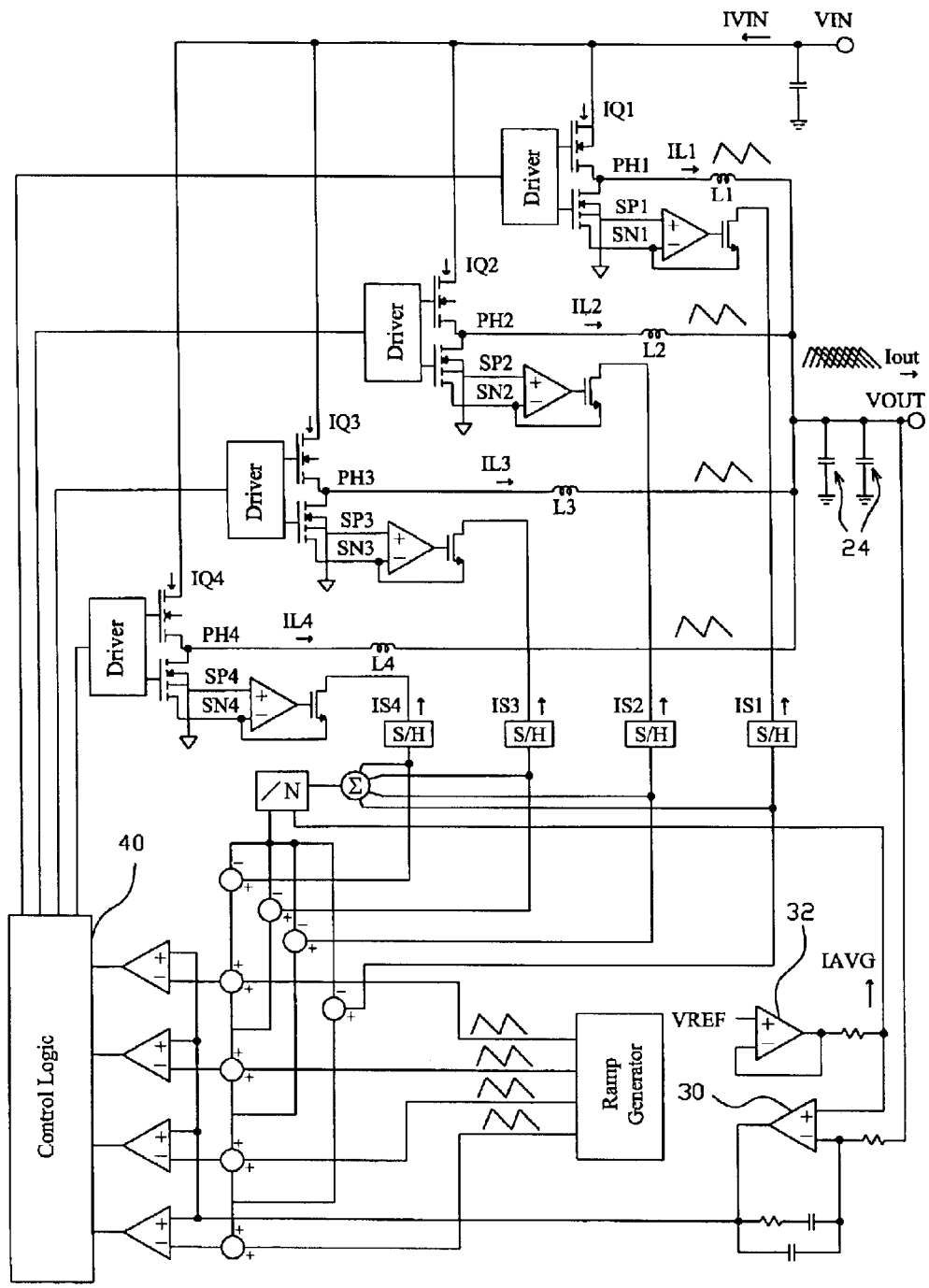
FIG. 5 is a four-phase DC-to-DC converter circuit incorporating the invented current sense apparatus.
Figure 6:
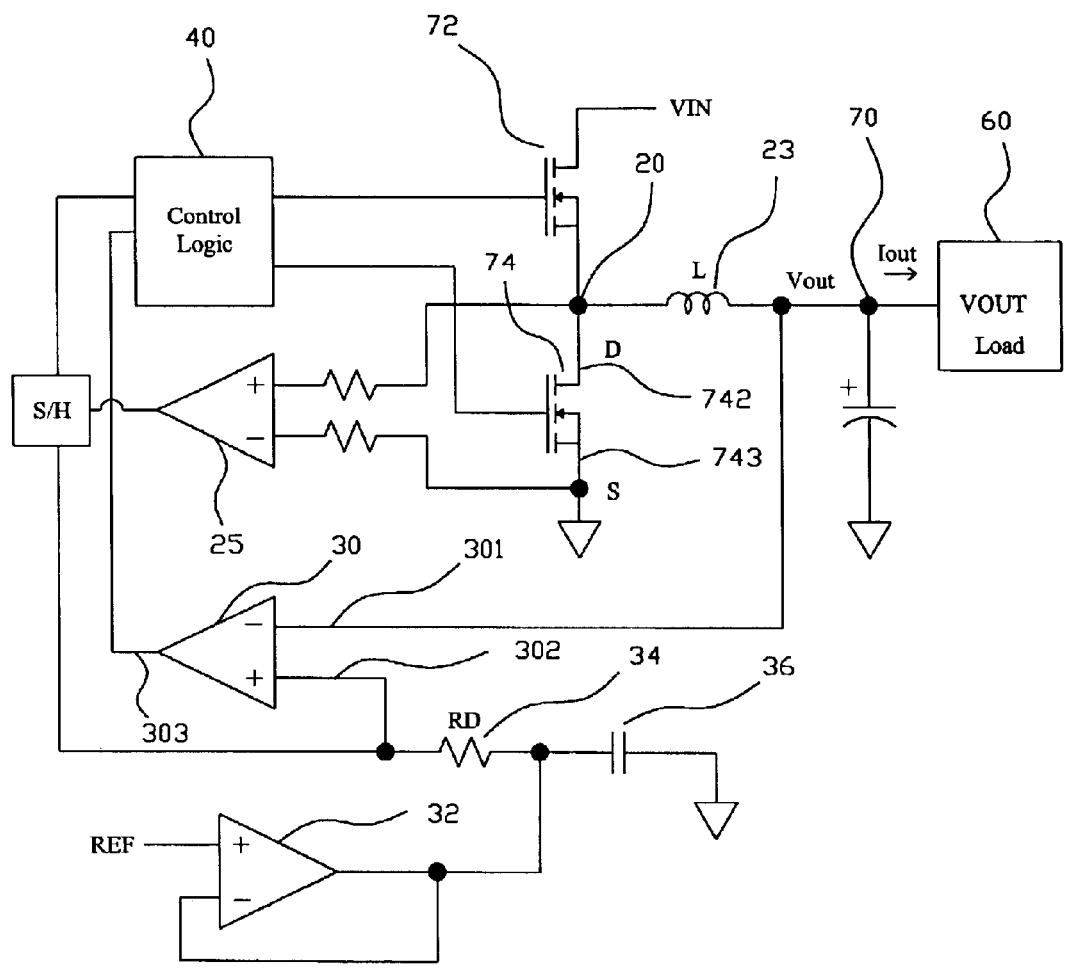
FIG. 6 is a simplified circuit diagram for one phase of a conventional converter.
Figure 7A:
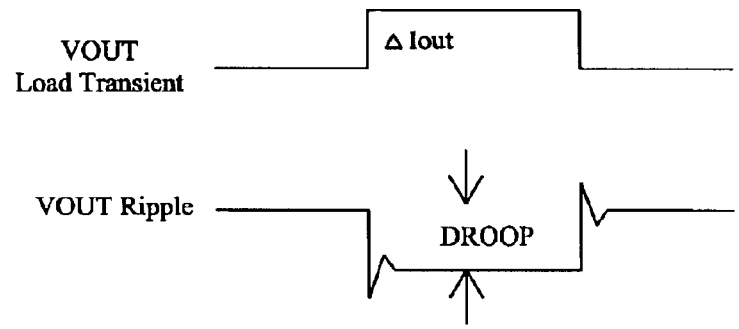
FIG. 7A shows the waveforms of the droop of the converter output voltage of the circuit in FIG. 6 resulted from load variation at low temperature.
Figure 7B:
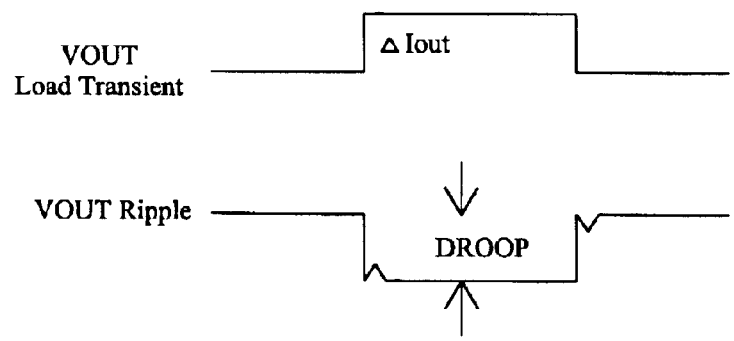
FIG. 7B shows the waveforms of the droop of the converter output voltage of the circuit in FIG. 6 resulted from load variation at high temperature.
Figure 8:
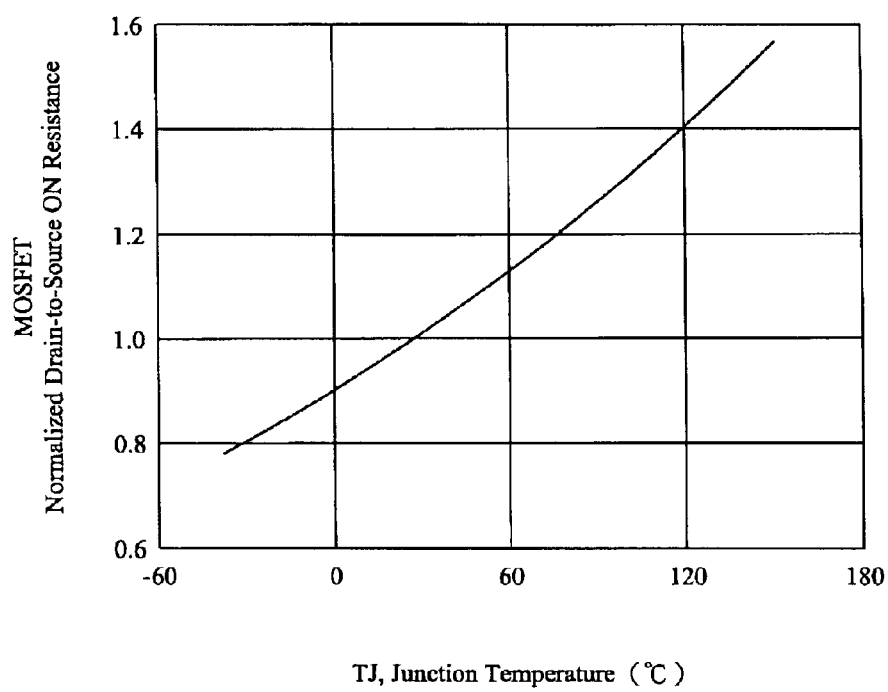
FIG. 8 shows the curve of the internal resistance of MOSFET to temperature.
Figure 9:
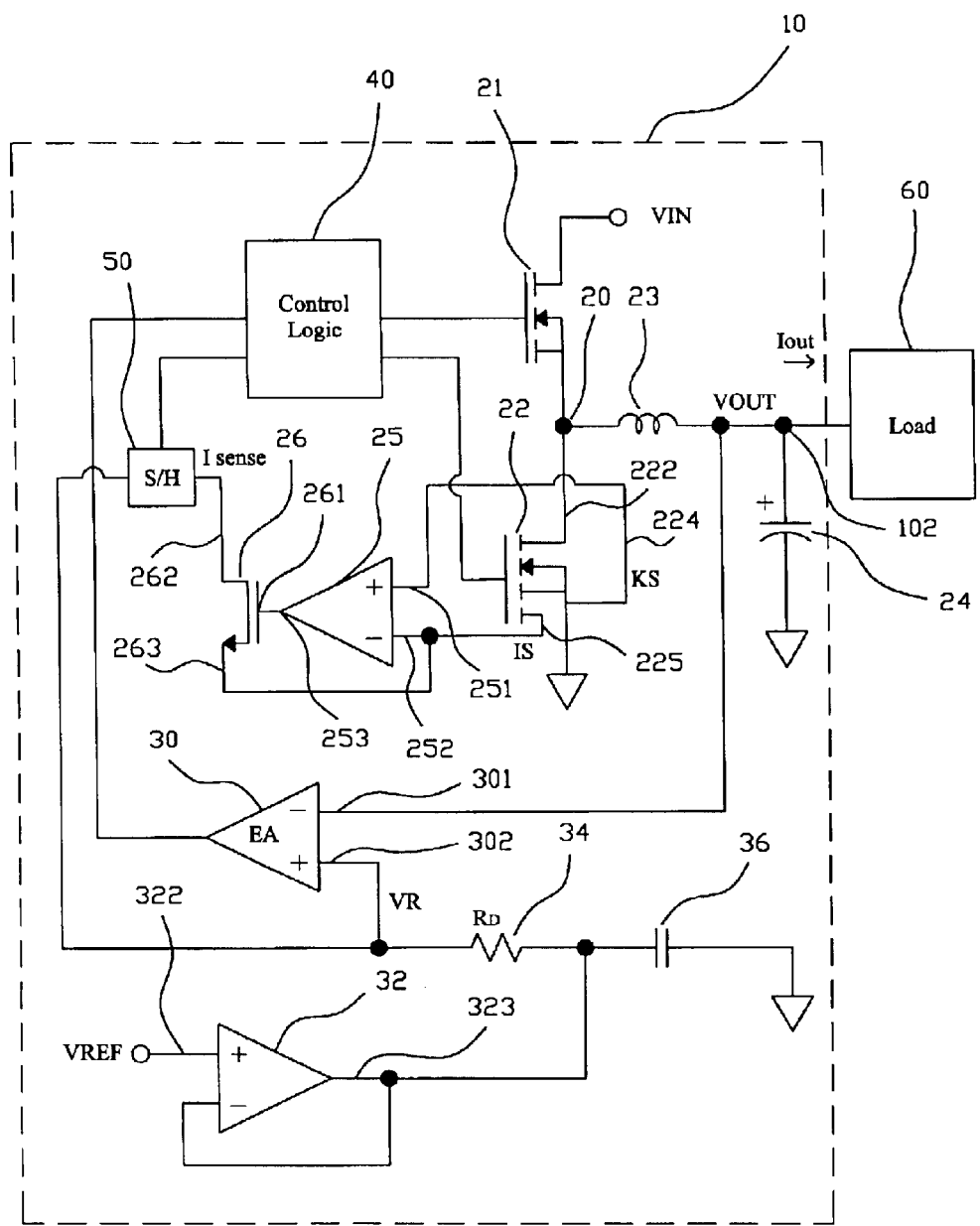
FIG. 9 is a simplified circuit diagram for one phase of the converter in FIG. 5.

FIG. 5 is an embodiment for a four-phase switching mode DC-to-DC converter with the invented current sense apparatus. As in a conventional converter, this circuit includes a control logic 40 to receive feedback signals from the converter output VOUT through a voltage feedback circuit and from the output stages of each phase through respective current feedback circuits to achieve stable converter output voltage VOUT and balanced currents in each phase. In order to produce the feedback signals from each phase, the output stages in each phase all use the circuit in FIG. 4B. For simplicity, one phase of the circuit in FIG. 5 is shown in FIG. 9. This single-phase circuit 10 includes an output stage connected between an input voltage VIN and ground to produce a phase output voltage at its phase output node 20, a sense voltage KS at output 224, a phase output current Io at drain 222, and a mirror current IS at output 225. A servo amplifier is connected with the mirror current IS to provide a current sense signal Isense to the current feedback circuit to produce the current feedback signal. A voltage feedback circuit produces a voltage feedback signal according to the converter output voltage VOUT and a reference voltage VR. A control logic 40 receives the current feedback signal and voltage feedback signal to produce a control signal to drive MOSFET 21 and common drain DMOSFET 22. The output stage includes MOSFET 21 connected between the input voltage VIN and phase output node 20, and common drain DMOSFET 22 connected between the phase output node 20 and ground. Besides, an output inductor 23 is connected between the phase output node 20 and converter output 102, and an output capacitor 24 is connected between the converter output 102 and ground. When the common drain DMOSFET 22 is conductive, the phase output current Io is produced at the drain 222, the mirror current IS is mirrored from the phase output current Io at the IS terminal 225, and a voltage is produced at the KS terminal 224. The servo amplifier includes an operational amplifier 25 and a MOSFET 26 with its gate connected to the output 253 of the operational amplifier 25, and source 263 connected to the inverting input 252 of the operational amplifier 25. The non-inverting input 251 and inverting input 252 of the operational amplifier 25 are connected with the voltage KS and mirror current IS of the common drain DMOSFET 22 to produce the current sense signal Isense to the sampling/holding circuit 50 so as to produce the current feedback signal to the control logic 40. The voltage feedback circuit includes an error amplifier 30, whose inverting input 301 is connected with the converter output voltage VOUT, and non-inverting input 302 is connected with the reference voltage VR. The non-inverting input 322 of a voltage follower 32 is connected with an original reference voltage signal VREF, and its output 323 provides the reference voltage VR to the node between capacitor 36 and resistor 34. The other terminals of the capacitor 36 and resistor 34 are grounded and connected to the non-inverting input 302 of the error amplifier 30, respectively. The capacitor 36 is used to stabilize the reference voltage VR, and the resistor 34 is used to scale the VDROOP or the variation of the converter output voltage VOUT changing with load variation. The non-inverting input 302 of the error amplifier 30 is also connected to the sampling/holding circuit 50, and the error amplifier 30 compares the converter output voltage VOUT and reference voltage VR to produce a voltage feedback signal to the control logic 40. The control logic 40 receives the current feedback signal and voltage feedback signal to produce the control signal to drive the MOSFET 21 and common drain DMOSFET 22 in the output stage.

As described above, due to the mirror current IS of the common drain DMOSFET 22 proportional to the phase output current Io, the detection of the phase output current Io by the current sense apparatus is temperature independent, and the current sense signal Isense will not be introduced with error by temperature variation. On the other hand, the voltage droop VDROOP is determined by the current sense signal Isense and the resistance RD of the resistor 34, responsive to the load variations.

In particular, $$VDROOP=Isense \times RD,$$

and $$VOUT=VREF-VDROOP.$$

Figure 10A:
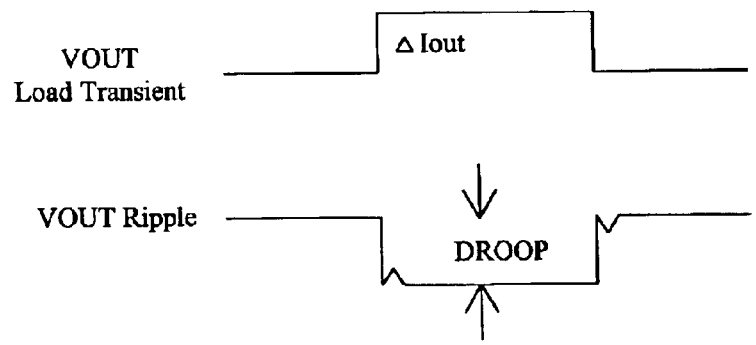
FIG. 10A shows the waveforms of the droop of the converter output voltage of the circuit in FIG. 9 resulted from load variation at low temperature.
Figure 10B:
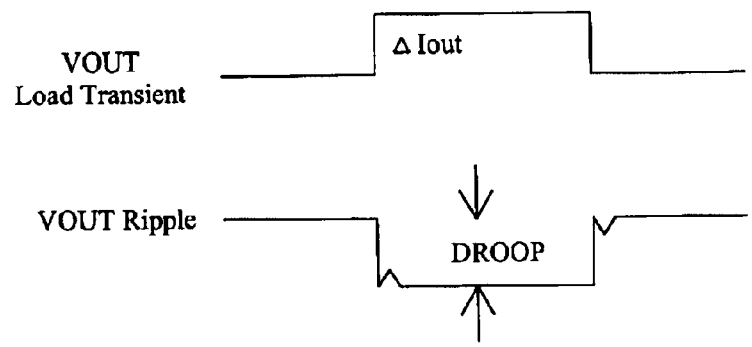
FIG. 10B shows the waveforms of the droop of the converter output voltage of the circuit in FIG. 9 resulted from load variation at high temperature.

Since the current sense signal Isense is independent of temperature variation, the variation of the converter output is also independent of temperature variation, as shown in FIG. 10. FIG. 10A shows the waveforms at low temperature, of which the upper one shows the transient performance of the variation Δ Iout of the converter output current Iout resulted from load variation, and the lower one shows the ripple performance of the converter output voltage VOUT induced by this transient effect. FIG. 10B shows the waveforms at high temperature, of which for same load variation, the droop VDROOP of the converter output voltage VOUT is as small as that shown in FIG. 10A. In other words, the invented apparatus and method eliminates the influence by temperature. Although it is illustrated by use of common drain DMOSFET in the above embodiments, other devices or circuits are also applicable if the described mirror current is used in a same manner.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A switching mode DC-to-DC converter for generating a converter output voltage, the converter comprising:

one or more output stages each connected, between a high voltage and a low voltage for producing a phase output current, a mirror current proportional to the phase output current, a phase output voltage and a sense voltage;

one or more serve amplifiers each for converting the mirror currant to a current sense signal;

a voltage feedback circuit for comparing the converter output voltage with a reference voltage to thereby produce a voltage feedback signal;

one or more current feedback circuits each connected with the current sense signal for producing a current feedback-signal; and a control logic connected with the voltage feedback signal and one or more current feedback signals for producing a control signal to drive the one or more output stage.

2. The converter of claim 1, wherein the output stage comprises:

a phase output node for deriving the phase output voltage;

a common drain DMOSFET connected between the high voltage and phase output node; and a MOSFET connected between the law voltage and phase output node.

3. The converter of claim 2, wherein the common drain DMOSFET has a gate, a drain connected to the high voltage, a source connected to the phase output node, a current mirror terminal far providing the mirror current, and a sense terminal for providing the sense voltage.

4. The converter of claim 1, wherein the output stage comprising:

a phase output node for deriving the phase output voltage;

a MOSFET connected between the high voltage and phase output mode; and a common drain DMOSFET connected between the low voltage and phase output node.

5. The converter of claim 4, wherein the common drain DMOSFET has a gate, a drain connected to the phase output node, a source connected to the low voltage, a current mirror terminal for providing the mirror current, and a sense terminal for providing the sense voltage.

6. The converter of claim 1, wherein the servo amplifier comprises:

an operational amplifier having an inverting input connected with the mirror current, a non-inverting input connected with the sense voltage, and an output; and a MOSFET having a source connected with the inverting input of the operational amplifier, a gate connected with the output of the operational amplifier, and a drain for providing the current sense signal.

7. The converter of claim 1, wherein the voltage feedback circuit comprises:

a reference voltage generator for producing the reference voltage; and an error amplifier having a non-inverting input connected with the reference voltage and an inverting input connected with the converter output voltage for producing the voltage feedback signal.

8. The converter of claim 7, wherein the reference voltage generator comprises:

a voltage follower connected with an original reference voltage signal for producing the reference voltage;

a capacitor connected to the voltage follower for stabilizing the reference voltage; and a resistor connected between the non-inverting input of the error amplifier and voltage follower for determining a droop of the converter output voltage.

9. The converter of claim 1, wherein the current feedback circuit is connected with the reference voltage.

* * * * *